United States Patent [19]

Taylor et al.

[11] 4,405,897
[45] Sep. 20, 1983

[54] FREQUENCY DEVIATION TESTING AND ADJUSTING SYSTEM FOR FREQUENCY MODULATED OSCILLATORS

[75] Inventors: Alistair W. Taylor, North Vancouver; Josef Fikart, Port Coquitlam; David Thompson, Coquitlam, all of Canada

[73] Assignee: AEL Microtel Ltd., Burnaby, Canada

[21] Appl. No.: 239,757

[22] Filed: Mar. 2, 1981

[51] Int. Cl.³ .............................................. G01R 23/15
[52] U.S. Cl. ................................. 324/78Z; 324/79 D; 331/44; 332/20
[58] Field of Search ...................... 331/44, 64; 332/18, 332/19, 20; 324/78 R–78 Z, 79 R, 79 D; 455/67, 115

[56] References Cited

U.S. PATENT DOCUMENTS

| | | | |
|---|---|---|---|
| 3,512,089 | 5/1970 | Cushman | 332/20 X |
| 3,549,997 | 12/1970 | Rotzel | 324/79 D |
| 3,571,760 | 3/1971 | Schwartz et al. | 332/20 |
| 4,122,391 | 10/1978 | Harp et al. | 324/78Z |

Primary Examiner—Siegfried H. Grimm
Attorney, Agent, or Firm—Leonard R. Cool

[57] ABSTRACT

Deviation of a frequency modulated oscillator (FMO) is set by applying a square wave test signal to the input of the oscillator so as to generate a predetermined amount of symmetrical periodic frequency shift above and below the rest frequency, i.e., the carrier frequency of the FMO, for a desired setting of the FMO's modulation sensitivity. The FMO frequency is divided down so as to be within the range of a programmable divider in the automatic phase control circuit of the oscillator. The carrier frequency is set by program switches which are connected to an interface logic unit that provides the control information to set the divisor of the programmable divider. During testing, the square wave test signal is also applied to a control input of the interface logic unit, for adjusting the divisor so as to provide at the output a binary signal having a predetermined pulse repetition rate when the modulated signal is applied to the input to the programmable divider and the deviation is correctly set. A reference oscillator provides a separate binary signal which has a pulse repetition rate equal to that of said predetermined pulse repetition rate. These two binary signals are compared in a deviation test circuit and the modulation sensitivity of the FMO is adjusted until the difference between the two binary signals is at a minimum.

5 Claims, 4 Drawing Figures

FREQUENCY DEVIATION TESTING AND ADJUSTING SYSTEM FOR FREQUENCY MODULATED OSCILLATORS

BACKGROUND OF INVENTION

This invention relates to frequency modulation measurements and more particularly to a novel method and apparatus for accurately testing and adjusting the modulation sensitivity and, hence, the frequency deviation of a frequency modulated oscillator (FMO). A technique for measuring the frequency deviation of a frequency modulated oscillator is disclosed in U.S. Pat. No. 3,549,997, issued Dec. 22, 1970, inventor D. Rotzel, wherein a frequency modulated signal and a reference signal are separately used to derive zero crossing pulses which are separately coupled to counters via gates. The frequency modulated signal is additionally coupled to a pulse shaper via a discriminator which generates a pulse that opens the gates to initiate counting. Each gate is separately closed by its associated counter when a predetermined count is reached for that counter. The time elapsing between the closing of the respective gates is a measure of the frequency deviation. The time is measured by coupling the gate closing signals via an exclusive-OR gate to another gate which allows pulses from a timing pulse generator to reach a direct reading counter. One problem with this technique is that the time measurement will vary depending upon whether the frequency modulated signal is started during its positive half-cycle when its frequency will be greater than that of the reference frequency, or during its negative half-cycle, when its frequency will be less than the reference frequency. In order to reduce the effects of short time fluctuations, the deviation must be determined by taking an average value of the measurements. Another frequency deviation measuring system is disclosed in U.S. Pat. No. 4,122,391, issued Oct. 24, 1978, inventors Maurice C. Harp, et al., wherein a calibrated unipolar signal is used to deviate a frequency modulated oscillator by a predetermined amount $f_s$, from a carrier $f_c$. An automatic frequency control circuit is normally connected in the feedback control path and, when connected, would operate to bring the carrier back on frequency and a meter connected in the control circuit would read this departure from normal. However, during the test for the correct deviation, a frequency shifter is connected between the output of the frequency modulated oscillator and the input of the automatic frequency control circuit. The frequency shifter is set to provide the frequency shift necessary to set its output to that of the carrier alone if the test signal has been deviated the correct amount. In this case, the indication on the test meter would be the same as the unmodulated carrier, indicating correct adjustment. However, if the deviation caused by the calibrated unipolar signal is not equal to that incorporated in the frequency shifter, the meter reading would reflect this fact and adjustment would be necessary. In one embodiment of the invention, a programmable counter is used in the automatic frequency control circuit and the program is modified a fixed amount when the test function switch is set to apply the unipolar pulse to the frequency modulated oscillator. Thus, the programmable counter replaces the frequency shifter in the deviation test circuit. The disadvantages of this technique lie in the use of a unipolar pulse rather than a symmetrical square wave for the modulation test signal. The use of the square wave allows the reduction in time for adjusting the deviation and a relative decrease in noise of the detected signal, hence a usable increase in sensitivity over the unipolar pulse approach.

SUMMARY OF INVENTION

In apparatus for setting the frequency deviation of a frequency modulated oscillator, a square wave modulation test signal has an amplitude which has been adjusted to modulate the carrier frequency of said oscillator in order to obtain a predetermined frequency shift above and below the carrier frequency when the deviation is set correctly. An adjustable frequency setting circuit accepts at a first input terminal the output signal of the frequency modulated oscillator and this signal is used to establish and maintain the desired carrier frequency of the frequency modulated oscillator and to provide at a second output terminal a binary signal having a predetermined pulse repetition rate when the desired carrier frequency is present. The adjustable frequency setting circuit accepts at another input terminal the square wave modulation signal so as to vary the frequency adjustment in order to obtain the same pulse repetition rate at the second output terminal if the deviation is properly set. A reference oscillator provides a binary signal having said predetermined pulse repetition rate and the two binary signals are compared in a comparator to determine if there is a difference therebetween.

DETAILED DESCRIPTION OF PREFERRED EMBODIMENTS

Figure 1:
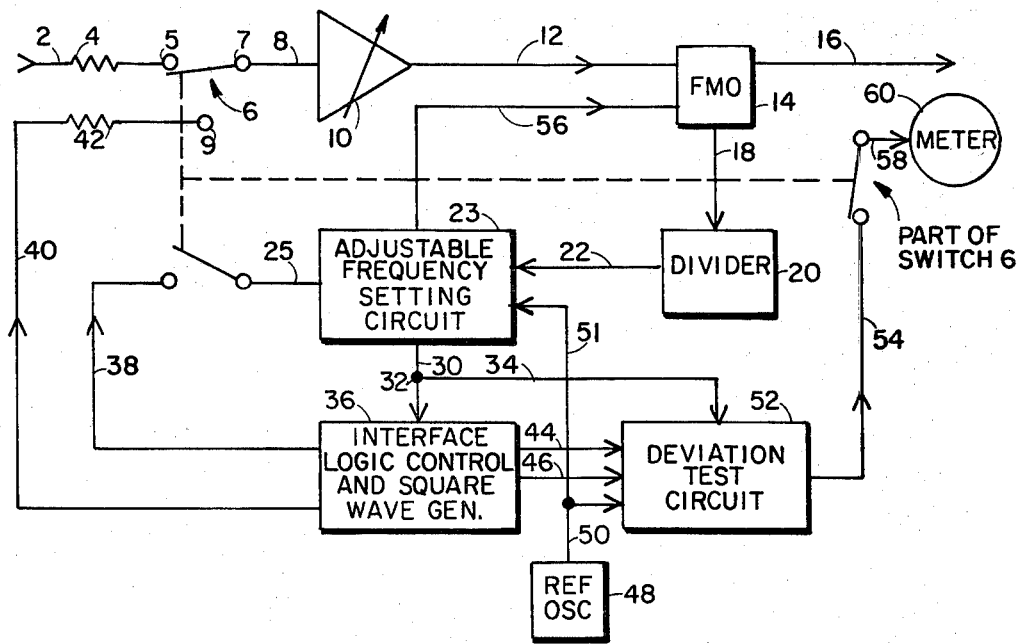
FIG. 1 is a block diagram of a preferred embodiment of the invention.
Figure 2:
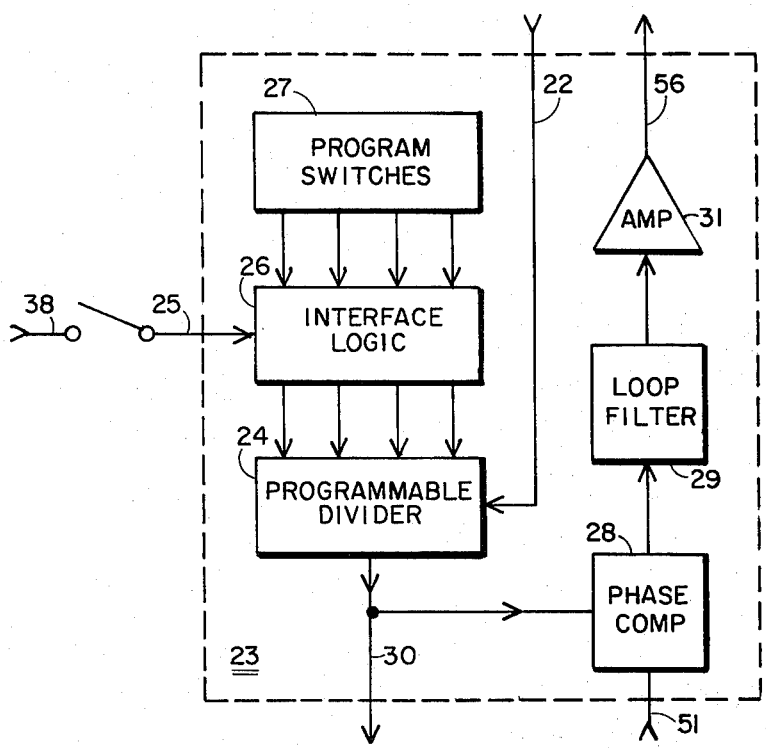
FIG. 2 is a block diagram of the frequency setting circuit (23)

Referring now to FIG. 1, it may be seen that the normal modulation signals would be applied along path 2 bridging resistor 4 and switch 6 path 8 to modulation amplifier 10 and thence along path 12 to frequency modulated oscillator 14, with the modulated output being applied to subsequent equipment along the path 16. To maintain the frequency modulated oscillator on its correct frequency, a portion of the output is applied via path 18 to divider 20 and thence along path 22 to one input of adjustable frequency setting circuit 23. Divider 20 may or may not be required, depending upon the oscillator frequency and the range of the circuitry included in block 23. One element of block 23 is an automatic phase control circuit, and this may be seen by referring to FIG. 2, where the input along path 22 is applied to programmable divider 24 which produces a binary output having a predetermined pulse repetition rate on path 30, a portion of which is applied to phase comparator 28, for comparison with the frequency from reference oscillator 48. The output of the phase comparator is then applied to loop filter 29 and amplifier 31 and thence back along path 56 to a control input of the frequency modulated oscillator 14. Most often a frequency modulated oscillator is realized as a voltage controlled oscillator (VCO) and thus the control signal applied on path 56 is normally a DC voltage, the amplitude of which controls the frequency of the oscillator.

Figure 3:
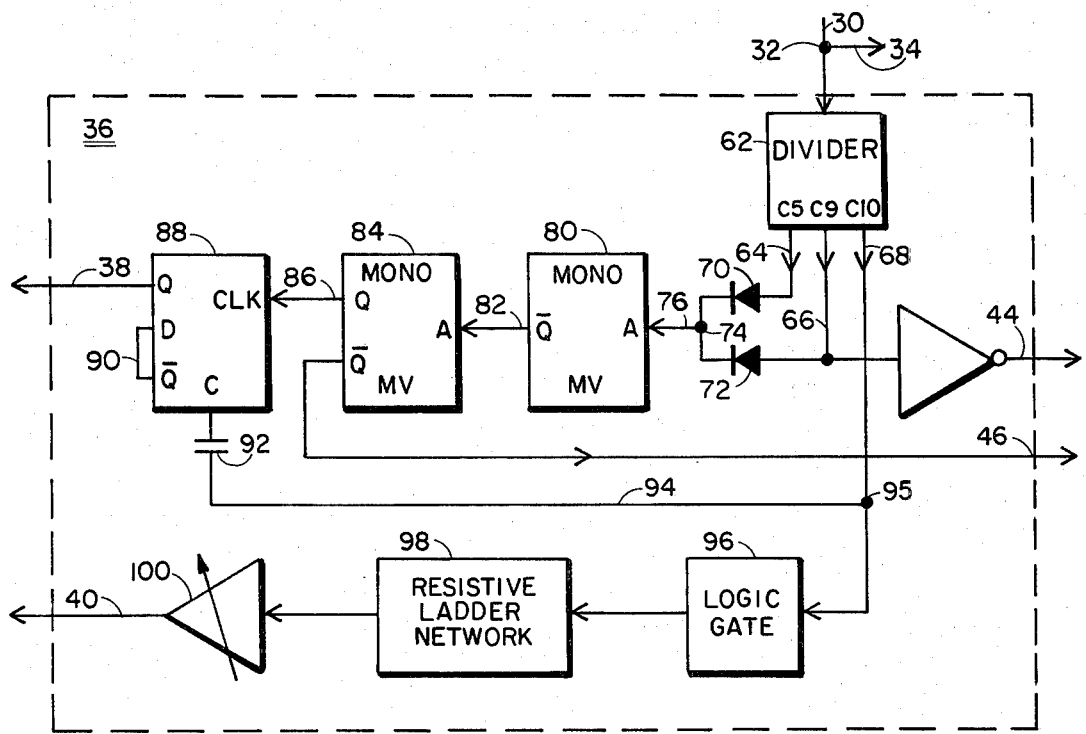
FIG. 3 is a block diagram of the interface logic control and square wave generator (36)

In the deviation test mode condition, function switch 6 is turned so that the normal input path is open and the modulation amplifier input is now connected to the output of the interface logic control and square wave generator circuit 36 via path 40, bridging resistor 42, switch 6 terminals 7 to 9 and path 8. In addition, the adjustable frequency setting circuit has an input connected via path 25, function switch 6 and path 38 to block 36. Further, meter 60 is connected into the circuit so as to measure the output of the deviation test circuit 52 via path 54. Referring now to FIG. 3, it may be seen that the binary output from programmable divider 24 is applied to divider 62 which divides the pulse repetition rate by 10. This lower rate signal is applied via path 68, junction 95 and logic gate 96, which is operated via the function switch 6, to a resistive ladder network 98. The ladder network 98 provides attenuation and the appropriate circuit impedance for the amplifier 100 which is adjustable and must be set to provide the proper square wave input to the modulation amplifier in order to obtain the predetermined frequency shift above and below the carrier frequency when the deviation is properly adjusted.

In one application of the invention, four program switches were used, each of which could be mechanically set to provide appropriate electrical control inputs to a series of four binary coded decimal adder/subtractor circuits, the latter of which make up the interface logic. In one application, these switches were used to establish a carrier frequency for the frequency modulated oscillator in the order of magnitude of 2 GHz. The square wave input on path 38, switch 6 and path 25 provided control information to the BCD adder/subtractor circuits which changed the program count ±1, e.g., for an original carrier frequency setting of 1.535 GHz the modulation test signal would cause the programmable counter to change between 1.534 and 1.536 GHz. It is to be noted that the shift of the programmable counter and the output of the frequency modulated oscillator are coincident so that if the deviation is correct the frequency shift of the output of the frequency modulated oscillator will be ±1 MHz. If this is the case, then the binary signal appearing at path 30 will have the same pulse repetition rate as it does for the carrier alone. The frequency selected for this pulse repetition rate was 333⅓ Hz. Thus, the test modulation square wave signal applied to the modulation amplifier 10 via path 40 has a pulse rate of 33⅓ Hz. In order to obtain the coincidence noted above, the outputs from the fourth and ninth outputs of divider 62 are applied, respectively, on paths 64 and 66 to diodes 70 and 72. These diodes essentially form an OR-gate, the output of which is applied via path 76 to the input of a dual monostable multivibrator consisting of multivibrators 80 and 84. A delay of the pulses from divider 62 is introduced in the first multivibrator stage and the second stage is triggered by the rising edge of the delayed pulses to provide clock pulse outputs on the path 86 to the clock input of D-type flip-flop 88. The D input is connected via path 90 to the Q̄ output of flip-flop 88 so that a square wave output is obtained for every two pulses provided at the clock input on path 86. By using the OR-gate and the outputs on outputs 4 and 9 of divider 62, the square wave output on path 38 is timed to reprogram programmable divider 24 via interface logic 26 so as to shift the divisor coincidentally with the frequency shift of the frequency modulated oscillator output. To insure that the proper phase relation is maintained between the programming of the counter and the deviation of the frequency modulated oscillator, a synchronization circuit is connected to node 95 along path 94 via capacitor 92 to the clear input of the D-type flip-flop 88. The function of this synchronization circuit is to prevent the output of the D-type flip-flop 88 from being 180° out of phase with the square wave output on path 40. As will be discussed in more detail later, the outputs on paths 44 and 46 are used for synchronization purposes in the deviation test circuit 52.

Figure 4:
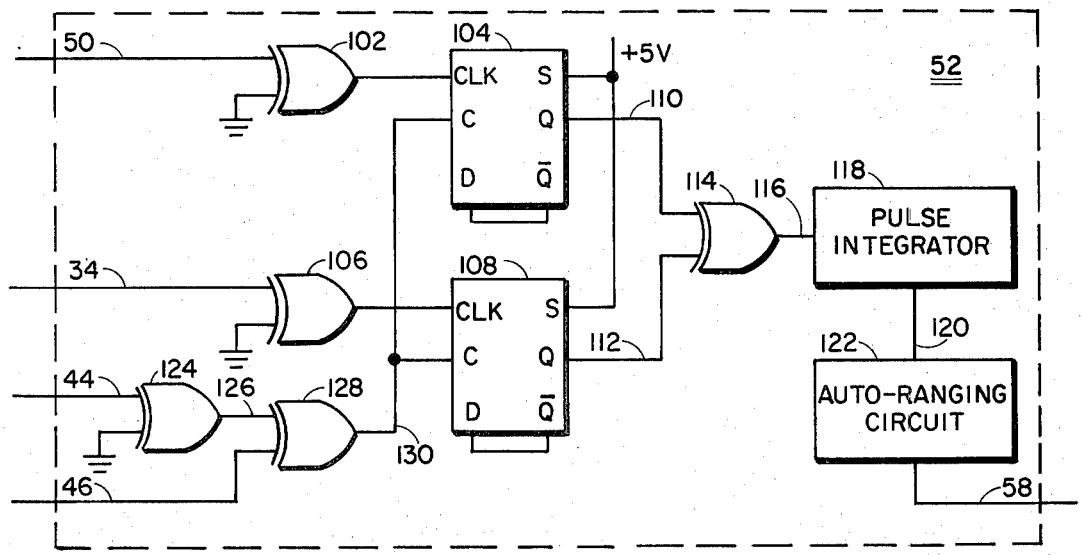
FIG. 4 is a block diagram of the deviation test circuit (52).

Referring now to FIG. 4, it may be seen that the output of the reference oscillator 48 on path 50 is applied to one input of exclusive-OR gate 102 and the other input is connected to ground so that a pulse is applied from the output of the exclusive-OR gate 102 to the clock input of D-type flip-flop 104. Also the binary output from the programmable divider along path 30, node 32 and path 34 is applied to one input of exclusive-OR gate 106 and the other input of exclusive-OR gate 106 is connected to ground so that a pulse is applied to the clock input of D-type flip-flop 108 only when a pulse appears on path 34. The D-input of both flip-flops 104 and 108 are connected respectively to their Q̄ output so that each flip-flop is toggled by the input from the respective OR-gates. Thus, assuming for the moment that the flip-flops 104 and 108 are properly phased, the Q outputs on paths 110 and 112, respectively, would be of the same binary state provided that the deviation is properly adjusted. Thus, exclusive-OR gate 114 would have a zero output on path 116. However, where the deviation is not properly adjusted, the occurrence of a pulse on path 34 will not be coincident with that applied by the reference oscillator on path 50 so that the clock input of toggle flip-flop 108 will cause the Q output to change state either before or after the change of state at the Q output of toggle flip-flop 104. It would be expected that the states on paths 110 and 112 would be identical during a great portion of the pulse period, and thus the output on path 116 from exclusive-OR gate 114 would be narrow pulses which would appear at those times when the inputs to the exclusive-OR gate 114 are different. A pulse integrator 118 is then employed to provide an average DC output signal which is proportional to the error in the deviation. This is applied via path 120 and an auto-ranging circuit 122 via path 58 to a meter circuit 60. The modulation sensitivity adjustment of the FMO is accomplished by adjusting amplifier 10 so as to obtain a minimum reading on meter 60.

In order to maintain the proper phase relationship for the two toggle flip-flops, the 9 count of divider 62 is inverted and applied via path 44 to one input of exclusive-OR gate 124 which has its other input connected to ground and the output applied to one input of exclusive-OR gate 128. The other input to exclusive-OR gate 128 is applied from the Q̄ output of monostable multivibrator 84 via path 46 and the output is applied along path 130 to the clear inputs of the toggle flip-flops 104 and 108. A very small pulse is generated by this technique which synchronizes the toggle flip-flops to avoid phase inversion.

While the invention has been particularly shown and described with reference to a preferred embodiment thereof, it will be understood by those skilled in the art that change in form and detail can be made therein without departing from the spirit and scope of the invention.

What is claimed is:

1. Apparatus for setting the frequency deviation of a frequency modulated oscillator (FMO) that operates at a prescribed carrier frequency and has a frequency control input and a modulation signal input, comprising:
   a square wave modulation signal generating circuit generating a square wave that is selectively applied to the FMO's modulation signal input, and that is of amplitude that is adjusted to modulate the FMO so as to produce a predetermined amount of symmetrical periodic frequency shift or deviation above and below the carrier frequency for a desired setting of the modulation sensitivity of the FMO;
   an adjustable frequency setting circuit providing at a first output terminal that is coupled to the control input of the FMO a signal controlling the carrier frequency, accepting at a first input terminal the output signal of the FMO so as to provide at a second output terminal a binary signal having a predetermined pulse repetition rate when the carrier frequency is present, and accepting at a second input terminal the square wave modulation signal so as to vary the frequency adjustment in order to obtain the predetermined pulse repetition rate at said second output terminal when the FMO produces the predetermined deviation and a different pulse repetition rate otherwise;
   a reference oscillator for providing a binary signal having a pulse repetition rate at said predetermined rate;
   means for comparing the binary output signals from said adjustable frequency setting circuit and from said reference oscillator to determine if there is a difference therebetween; and
   means for indicating when said difference is at a minimum;
   the modulation sensitivity of the FMO being adjusted to produce the predetermined amount of deviation in the output thereof.

2. Apparatus as set forth in claim 1 wherein said adjustable frequency setting circuit comprises:
   a programmable divider having a first input terminal connected to accept the output signal from the frequency modulated oscillator, and a plurality of additional input terminals into which control signals are applied to set the divisor so that the predetermined pulse repetition rate is obtained;
   a series of program switches, each of which provides at a plurality of output terminals control information which may be mechanically changed;
   an interface logic unit having a plurality of input terminals adapted to receive the control information from the plurality of output terminals of said series of program switches, and converting this information to control signals for setting the divisor of said programmable divider; and
   a conforming input terminal on said interface logic unit adapted for reception of said square wave modulation signal, whereby appropriate digits of the divisor are changed so as to conform to the predetermined symmetrical periodic frequency shift of the frequency modulated signal when the deviation is a predetermined amount.

3. Apparatus as set forth in claim 2 wherein said means for comparing comprises:
   a first logic circuit having an input terminal connected to receive the binary signal at the output of said programmable divider and providing a change of binary state at an output terminal for each pulse applied to said input;
   a second logic circuit having an input terminal connected to receive the binary signal from said reference oscillator and providing a change of binary state at an output terminal for each pulse applied to said input;
   a comparator having first and second input terminals connected, respectively, to said output terminal of said first and second logic circuits, and providing a signal at an output terminal only when the binary inputs are unlike.

4. Apparatus as set forth in claim 3 wherein said logic circuits each comprise:
   an exclusive-OR gate having one input terminal connected to ground and the other terminal connected to receive the binary signal so that there is an output only when a pulse is present on said other terminal; and
   a D-type flip-flop having the clock input connected to the output terminal of the exclusive-OR gate, and having the Q input connected directly to the D-input, whereby said flip-flop toggles.

5. Apparatus as set forth in claim 4 wherein said comparator comprises an exclusive-OR gate.

* * * * *